(12) United States Patent
Xiao (10) Patent No.: US 9,626,928 B2
(45) Date of Patent: Apr. 18, 2017

(54) LIQUID CRYSTAL DISPLAY DEVICE COMPRISING GATE DRIVER ON ARRAY CIRCUIT

(71) Applicant: SHENZHEN CHINA STAR OPTOELECTRONICS TECHNOLOGY CO., LTD, Shenzhen (CN)

(72) Inventor: Juncheng Xiao, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 101 days.

(21) Appl. No.: 14/418,087

(22) PCT Filed: Jan. 8, 2015

(86) PCT No.: PCT/CN2015/070318
§ 371 (c)(1),
(2) Date: Jan. 29, 2015

(87) PCT Pub. No.: WO2016/106802
PCT Pub. Date: Jul. 7, 2016

(65) Prior Publication Data
US 2016/0189648 A1    Jun. 30, 2016

(30) Foreign Application Priority Data
Dec. 31, 2014   (CN) .......................... 2014 1 0851563

(51) Int. Cl.
G09G 3/36     (2006.01)
G11C 19/28    (2006.01)
G11C 19/00    (2006.01)

(52) U.S. Cl.
CPC .......... *G09G 3/3677* (2013.01); *G11C 19/28* (2013.01); *G09G 2310/0286* (2013.01); *G09G 2310/08* (2013.01)

(58) Field of Classification Search
CPC .............................. G09G 3/3677; G11C 19/28
(Continued)

(56) References Cited

U.S. PATENT DOCUMENTS 9,190,170 B1    11/2015   Hao et al.
9,218,765 B2 *   12/2015   Kim ..................... G09G 3/3233
(Continued)

FOREIGN PATENT DOCUMENTS

CN    103474038 A    12/2013
CN    104091573 A    10/2014
(Continued)

*Primary Examiner* — Adam J Snyder
(74) *Attorney, Agent, or Firm* — Mark M. Friedman (57) ABSTRACT

A GOA (Gate On Array) circuit applied to a liquid crystal display device is disclosed. The liquid crystal display device has a plurality of scan lines. The GOA circuit has a plurality of cascaded shift register units. An (N)th level shift register unit controls charge to an (N)th level scanning line. The (N)th level shift register unit includes a forward-rearward scan circuit, a pull-up circuit, an bootstrap capacitor circuit, a gate signal point electricity leakage preventing circuit, and a pull-down sustain circuit. The bootstrap capacitor circuit, the gate signal point electricity leakage preventing circuit, and the pull-down sustain circuit are connected together with each other to form a gate signal point, so as to raise the stability of the gate signal point and to decrease the use of switches.

28 Claims, 6 Drawing Sheets

(58) Field of Classification Search
USPC .......................................... 345/100; 377/69
See application file for complete search history.

(56) References Cited

U.S. PATENT DOCUMENTS

| | | | | |
|---|---|---|---|---|
| 2012/0050234 A1* | 3/2012 | Jang | ................ | G09G 3/3225 345/76 |
| 2013/0009858 A1 | 1/2013 | Takahashi | | |
| 2014/0079176 A1* | 3/2014 | Qian | ................ | G09G 3/3611 377/77 |
| 2015/0029169 A1* | 1/2015 | Song | ................ | G09G 3/3225 345/82 |
| 2015/0043703 A1* | 2/2015 | Tan | ................ | G11C 19/28 377/68 |
| 2015/0379935 A1* | 12/2015 | Choi | ................ | G09G 3/3677 345/87 |
| 2016/0005346 A1* | 1/2016 | Kim | ................ | G09G 3/3266 345/690 |
| 2016/0180788 A1 | 6/2016 | Xiao | | |
| 2016/0189586 A1* | 6/2016 | Zou | ................ | G09G 3/20 345/213 |

FOREIGN PATENT DOCUMENTS

| | | |
|---|---|---|
| CN | 203910231 U | 10/2014 |
| CN | 104240765 A | 12/2014 |
| CN | 104575420 A | 4/2015 |
| KR | 100940999 B1 | 2/2010 |

* cited by examiner

LIQUID CRYSTAL DISPLAY DEVICE COMPRISING GATE DRIVER ON ARRAY CIRCUIT

BACKGROUND OF THE INVENTION

Field of Invention

The present invention relates to the field of liquid crystal display technology, and more particularly to a GOA (Gate Driver on Array) circuit of a PMOS (P-channel Metal Oxide Semiconductor) based on LIPS (Low-Temperature Poly-Si), which is applied for a liquid crystal display device.

Description of Prior Art

GOA is a technology which utilizes the existing array process of TFT (Thin Film Transistor) liquid crystal display to manufacture the gate scanning signal circuits on the array substrates, so as to accomplish the cascade scanning on gate electrodes.

With the development of LTPS TFTs, due to the characteristic of extreme super-high carrier mobility of LTPS by itself, the relative integrated circuits around the panels, such as GOA, has become the focus concerned for the public. Many people are investing in the research of the corresponding technology of SOP (System On Panel), and thus the technology gradually becomes accomplished. LTPS can adjust the types of TFT by ion-coating technology to choose NMOS (N type Metal Oxide Semiconductor), PMOS (P type Metal Oxide Semiconductor), or CMOS (Complementary Metal Oxide Semiconductor) circuits. However, compared to PMOS, the mask costs are greatly increased in CMOS and NMOS. Also, the circuit structure of CMOS is too complicated to achieve an extreme narrow bezel design, and when focusing on display devices with smaller sizes, this will become much more important. Thus, PMOS circuits have become the mainstream due to the advantages of cost and circuit structure. Moreover, signal usage and power consumption are important issues in GOA circuits, which needs to be considered when designing LTPS circuits. Furthermore, since the scanning characteristic of small size products such as forward scanning and reverse scanning are more important than other characteristics, a GOA circuit based on LTPS PMOS is helpful to solve the above issues.

SUMMARY OF THE INVENTION

An objective of the present invention is to provide a GOA circuit of PMOS based on LTPS, which is applied for a liquid crystal display device.

To achieve the above objective, the present invention provides a GOA circuit applied to a liquid crystal display device which comprises a plurality of scanning lines. The GOA circuit comprises a plurality of cascaded shift register units, wherein an (N)th level shift register unit controls charge to an (N)th level scanning line. The (N)th level shift register unit comprises a forward-rearward scan circuit, a pull-up circuit, a bootstrap capacitor circuit, a gate signal point electricity leakage preventing circuit, and a pull-down sustain circuit.

The pull-down sustain circuit is connected with the (N)th level scanning line. The bootstrap capacitor circuit is connected with the pull-down sustain circuit. The gate signal point electricity leakage preventing circuit is connected with the bootstrap capacitor circuit (300). The forward-rearward scan circuit is connected with gate signal point electricity leakage preventing circuit. The pull-up circuit is connected with the bootstrap capacitor circuit.

The bootstrap capacitor circuit, the gate signal point electricity leakage preventing circuit, and the pull-down sustain circuit are connected together with each other to form a gate signal point.

The pull-up circuit, the bootstrap capacitor circuit, and the gate signal point electricity leakage preventing circuit are respectively connected with the (N)th level scanning line). The forward-rearward scan circuit is respectively connected an (N−1)th level scanning line and an (N+1)th level scanning line.

The pull-down sustain circuit comprises: a first switch having a control terminal which is connected with the gate signal point electricity leakage preventing circuit, and having an output terminal connected with a first circuit point; a second switch having a control terminal which is connected with the gate signal point, and having an output terminal connected with the first circuit point; a third switch having a control terminal which is connected with the first circuit point, having an input terminal connected with a high constant voltage, and having an output terminal connected with the (N)th level scanning line; a fourth switch has a control terminal which is connected with the first circuit point, and having an input terminal connected with the high constant voltage; a fifth switch having a control terminal which receives an (N)th level first clock signal, having an input terminal connected with an output terminal of the fourth switch, and having an output terminal connected with the gate signal point; and a first capacitor having two ends which are respectively connected with the high constant voltage and the first circuit point.

In one embodiment, the forward-rearward scan circuit comprises:

A sixth switch having a control terminal which receives an up-to-down control signal, having an input terminal connected with the (N−1)th level scanning line, and having an output terminal connected with the gate signal point electricity leakage preventing circuit.

A seventh switch having a control terminal which receives a down-to-up control signal, having an input terminal connected with the (N+1)th level scanning line, and having an output terminal connected with the output terminal of the fifth switch and the gate signal point electricity leakage preventing circuit.

In one embodiment, the gate signal point electricity leakage preventing circuit comprises:

A ninth switch having a control terminal which is connected with an input terminal of the first switch to receive an (N)th level second clock signal, having an input terminal connected with the output terminal of the sixth switch and the output terminal of the seventh switch, and having an output terminal connected with the gate signal point.

In one embodiment, the gate signal point electricity leakage preventing circuit comprises:

A ninth switch having a control terminal which is connected with an input terminal of the first switch and a constant low voltage, and having an output terminal connected with the gate signal point.

A tenth switch having a control terminal which is connected with the control terminal of the first switch, having an input terminal connected with the output terminal of the sixth switch and the output terminal of the seventh switch, and an output terminal connected with the input terminal of the ninth switch.

In one embodiment, the control terminal of the tenth switch is connected with the control terminal of the first switch to receive the (N)th level second clock signal.

In one embodiment, the pull-up circuit comprises:

An eighth switch having a control terminal which is connected with the gate signal point, having an input terminal connected with the (N)th level first clock signal, and having an output terminal connected with the (N)th level scanning line.

In one embodiment, the bootstrap capacitor circuit comprises:

A second capacitor having two ends which are respectively connected with the gate signal point and the (N)th level scanning line.

In one embodiment, the input terminal of the second switch is connected with the high constant voltage.

In one embodiment, the (N)th level shift register unit further comprises a pull-down control circuit, which comprises:

An eleventh switch having a control terminal which receives the up-to-down control signal, having an input terminal which receives a second positive clock signal, and having an output terminal connected with the pull-down sustain circuit and the gate signal point electricity leakage preventing circuit.

An twelfth switch having a control terminal which receives the down-to-up control signal, having an input terminal which receives a second reverse clock signal, and having an output terminal being connected with the pull-down sustain circuit and the gate signal point electricity leakage preventing circuit.

In one embodiment, the output terminal of the eleventh switch, the output terminal of the twelfth switch, and the control terminal of the first switch are connected with each other.

In one embodiment, the input terminal of the second switch is connected with the control terminal of the first switch.

In one embodiment, the pull-down sustain circuit further comprises:

A thirteenth switch having a control terminal which is connected with the gate signal point, having an input terminal connected with the control terminal of the first switch, and having an output terminal connected with the first circuit point.

In one embodiment, the pull-down sustain circuit further comprises:

A fourteenth switch having a control terminal which receives an (N−1)th level second clock signal, having an input terminal connected with the output terminal of the fourth switch, and having an output terminal connected with the gate signal point.

In one embodiment, the pull-down sustain circuit further comprises:

A fourteenth switch (T14) having a control terminal which receives an (N−2)th level second clock signal, having an input terminal connected with the output terminal of the fourth switch, and having an output terminal connected with the gate signal point.

In one embodiment, the (N)th level second clock signal and the (N)th level first clock signal are reverse signals with regard to each other.

In one embodiment, the first to the fourteenth switches are PMOS (P-channel metal-oxide semiconductor) thin film transistors.

With the technical proposal of the present invention, the advantages are as follows:

1. A design of GOA circuit of PMOS based on LTPS.

2. A forward and rearward scanning control function, which ensures that variant driving types of the display devices are stable during long-term operation.

3. With the arrangement of the first clock signal, the second clock signal, and the first capacitor, the pull-down sustain function of the gate signal point and the (N)th level scanning line is accomplished. With this arrangement, usage of signal lines and the amount of TFTs are reduced in the GOA circuit. Meanwhile, the function of the pull-down sustain circuit is improved by the connection of the input terminal of the second switch with the input terminal of the twelfth switch.

4. By using a direct-current low voltage to maintain the first circuit point during non-operation period, it is ensured that the ripple of the gate signal point and the (N)th level scanning line is eliminated.

5. With disposing the ninth switch to adjust the electricity leakage of the circuit, it functions on stability of the circuit.

DETAILED DESCRIPTION OF THE PREFERRED EMBODIMENTS

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, units with similar structures are marked with the same labels.

Figure 1:
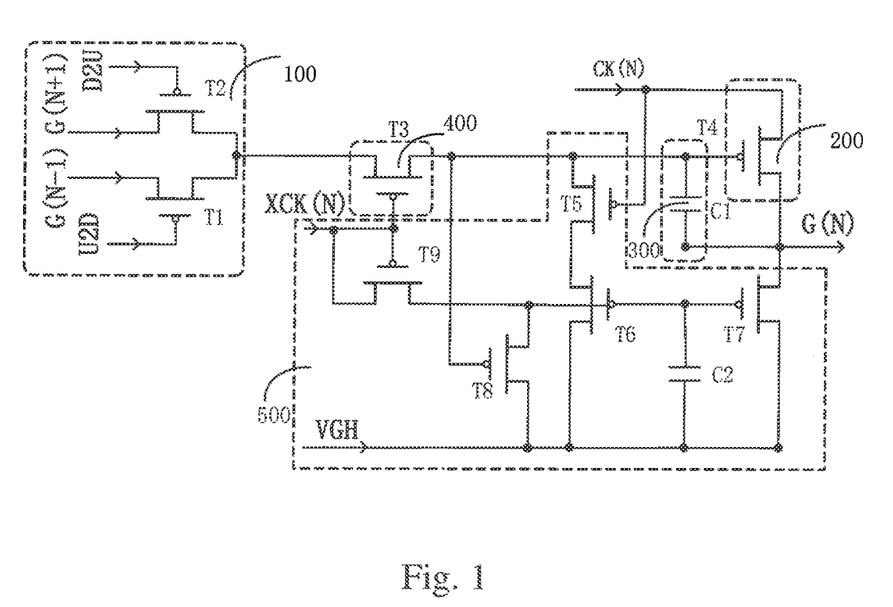
FIG. 1 is a circuit schematic diagram of a GOA circuit according to a first preferred embodiment of the present invention.

FIG. 1 is a circuit diagram of a GOA circuit according to a first preferred embodiment of the present invention. In the GOA circuit applied to a liquid crystal display device, the liquid display device comprises a plurality of scanning lines. The GOA circuit comprises a plurality of cascaded shift register units, wherein an (N)th level shift register unit controls charge to an (N)th level scanning line. The (N)th level shift register unit comprises a forward-rearward scan circuit (100), a pull-up circuit (200), a bootstrap capacitor circuit (300), a gate signal point (Q) electricity leakage preventing circuit (400), and a pull-down sustain circuit (500).

The pull-down sustain circuit (500) is connected with the (N)th level scanning line (G(N)). The bootstrap capacitor circuit (300) is connected with the pull-down sustain circuit (500). The gate signal point (Q) electricity leakage preventing circuit (400) is connected with the bootstrap capacitor circuit (300). The forward-rearward scan circuit (100) is connected with gate signal point (Q) electricity leakage preventing circuit (400). The pull-up circuit (200) is connected with the bootstrap capacitor circuit (300).

The bootstrap capacitor circuit (300), the gate signal point (Q) electricity leakage preventing circuit (400), and the pull-down sustain circuit (500) are connected together with each other to form a gate signal point (Q(N)).

The pull-up circuit (200), the bootstrap capacitor circuit (300) and the gate signal point (Q) electricity leakage preventing circuit (400) are respectively connected with the (N)th level scanning line (G(N)). The forward-rearward scan circuit (100) is respectively connected an (N−1)th level scanning line (G(N−1)) and an (N+1)th level scanning line (G(N+1)).

The pull-down sustain circuit (500) comprises: a first switch (T9) having a control terminal which is connected with the gate signal point (Q) electricity leakage preventing circuit (400), and having an output terminal connected with a first circuit point (P(N)); a second switch (T8) having a control terminal which is connected with the gate signal point (Q(N) and having an output terminal connected with the first circuit point (P(N)), an input terminal of the second switch (T8) is connected with the constant high voltage (VGH); a third switch (T7) having a control terminal which is connected with the first circuit point (P(N)), having an input terminal connected with a high constant voltage (VGH), and having an output terminal connected with the (N)th level scanning line (G(N)); a fourth switch (T6) having a control terminal which is connected with the first circuit point (P(N)), and having an input terminal connected with the high constant voltage (VGH); a fifth switch (T5) having a control terminal which receives an (N)th level first clock signal (CK(N)), having an input terminal connected with an output of the fourth switch (T6), and having an output terminal connected with the gate signal point (Q); and a first capacitor (C2) having two ends which are respectively connected with the high constant voltage (VGH) and the first circuit point (P(N)).

The forward-rearward scan circuit (100) comprises a sixth switch (T1) and a seventh switch (T2). The sixth switch (T1) comprises a control terminal which receives an up-to-down control signal (U2D), an input terminal connected with the (N−1)th level scanning line (G(N−1)), and an output terminal connected with the gate signal point (Q) electricity leakage preventing circuit (400). The seventh switch (T2) comprises a control terminal which receives a down-to-up control signal (D2U), an input terminal connected with the (N+1)th level scanning line (G(N+1)), and an output terminal connected with the output terminal of the fifth switch (T1) and the gate signal point (Q) electricity leakage preventing circuit (400).

The gate signal point (Q) electricity leakage preventing circuit (400) comprises a ninth switch (T3). The ninth switch (T3) comprises a control terminal which is connected with an input terminal of the first switch (T9) to receive an (N)th level second clock signal (XCK(N)), an input terminal connected with the output terminal of the sixth switch (T1) and the output terminal of the seventh switch (T2), and an output terminal connected with the gate signal point (Q(N)). The gate signal point (Q) electricity leakage preventing circuit (400) is responsible for preventing the issue of electricity leakage of the gate signal point (Q(N)) and adjusting the electric potential of the gate signal point during non-operation periods.

The pull-up circuit (200) comprises an eighth switch (T4). The eighth switch (T4) comprises a control terminal which is connected with the gate signal point (Q(N)), an input terminal connected with the (N)th level first clock signal (CK(N)), and an output terminal connected with the (N)th level scanning line (G(N)). The pull-up circuit (200) is responsible for outputting the (N)th level first clock signal (CK(N)), thereby rationally adjusting the electric potential of the gate signal point (Q(N)), and then outputting a signal of the desired (N)th level scanning line (G(N)).

The bootstrap capacitor circuit (300) comprises a second capacitor (C1). The second capacitor (C1) comprises two ends which are respectively connected with the gate signal point (Q(N)) and the (N)th level scanning line (G(N)). The bootstrap capacitor circuit (300) is responsible for the electric potential lifting of the gate signal point (Q(N)), thereby ensuring the output of the (N)th level first clock signal (CK(N)). The electric potential management of the gate signal point (Q(N)) is the key of the GOA circuit which will directly determine the performance of the circuit and the display of the panel.

In the preferred embodiment, the (N)th level first clock signal (CK(N)) and the (N)th level second clock signal (XCK(N)) are responsible for the pull-down sustain of the GOA circuit.

Figure 2:
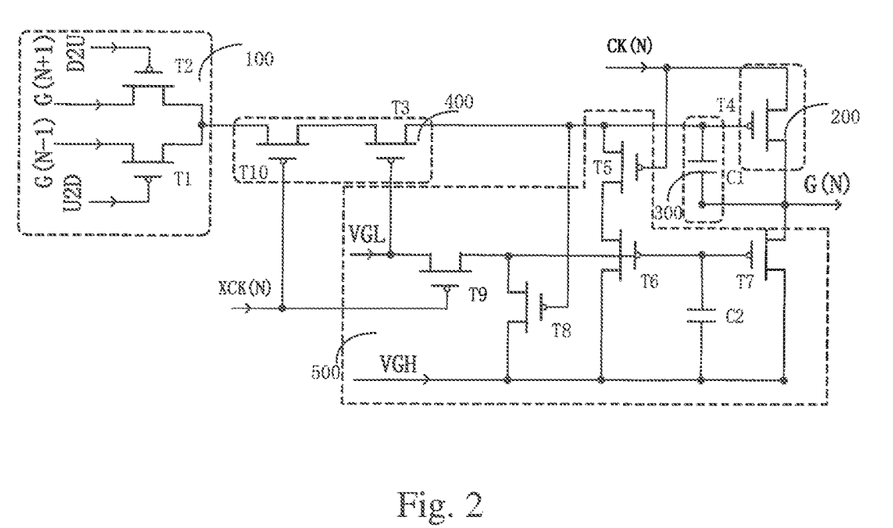
FIG. 2 is a circuit schematic diagram of a GOA circuit according to a second preferred embodiment of the present invention.

FIG. 2 is a circuit diagram of a GOA circuit according to a second preferred embodiment of the present invention. The difference between the second preferred embodiment and the first preferred embodiment is that the gate signal point (Q) electricity leakage preventing circuit (400) further comprises a tenth switch (T10). Also, the connection layouts of the first switch (T9) and the ninth switch (T3) are different in the first preferred embodiment and the second preferred embodiment. In the second preferred embodiment, the ninth switch (T3) comprises a control terminal which is connected with an input terminal of the first switch (T9) and a constant low voltage (VGL), an output terminal being connected with the gate signal point (Q(N)). The tenth switch (T10) comprises a control terminal which is connected with the control terminal of the first switch (T9), an input terminal being connected with the output terminal of the sixth switch (T1) and the output terminal of the seventh switch (T2), and an output terminal being connected with the input terminal of the ninth switch (T3). The input terminal of the first switch (T9), the ninth switch (T3) are connected with a constant low voltage (VGL). The control terminal of the tenth switch (T10) is connected with the control terminal of the first switch (T9) to receive the (N)th level second clock signal (XCK(N)).

In this preferred embodiment, with disposing the tenth switch (T10) into the gate signal point (Q) electricity leakage preventing circuit (400) and some changes to the circuit, the issue of electricity leakage is improved and the issue of unusual waveform of the gate signal point (Q(N)) is eliminated.

Figure 3:
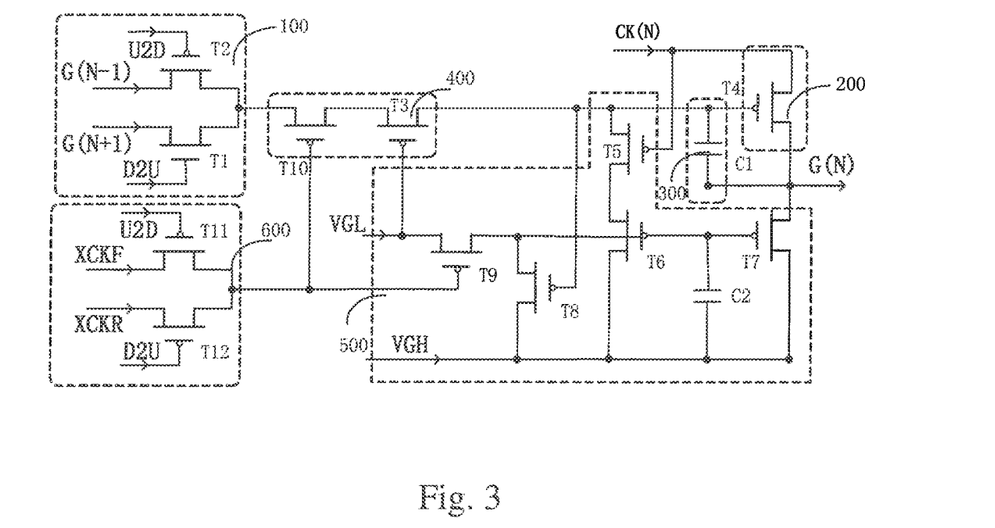
FIG. 3 is a circuit schematic diagram of a GOA circuit according to a third preferred embodiment of the present invention.

FIG. 3 is a circuit diagram of a GOA circuit according to a third preferred embodiment of the present invention. The difference between the third preferred embodiment and the second preferred embodiment is that the (N)th level shift register unit further comprises a pull-down control circuit (600). The pull-down control circuit (600) comprises an eleventh switch (T11) and a twelfth switch (T12). The eleventh switch (T11) comprises a control terminal which receives the up-to-down control signal (U2D), an input terminal which receives a second positive clock signal (XCKF), and an output terminal being connected with the pull-down sustain circuit (500) and the gate signal point (Q) electricity leakage preventing circuit (400). The twelfth switch (T12) comprises a control terminal which receives the down-to-up control signal (D2U), an input terminal receives a second reverse clock signal (XCKR), and an output terminal being connected with the pull-down sustain circuit (500) and the gate signal point (Q) electricity leakage preventing circuit (400). The pull-down control circuit (600) is responsible for the pull-down of the circuit during maintenance periods, thereby maintaining the forward and rearward control structures to be independent of each other, for cascade transferring of the (N)th level scanning line (G(N)).

In this preferred embodiment, the pull-down sustain circuit (500) uses a pair of reverse signals to work, which are the (N)th level first clock signal (CK(N)) and the (N)th level second clock signal (XCK(N)). The second positive clock signal (XCKF) and the second reverse clock signal (XCK(N)) introduce the constant low voltage (VGL) to the control terminal of the fourth switch (T6) and the control terminal of the third switch (T7) at the first stage, to store the low voltage with the first capacitor (C2). Meanwhile, the fifth switch (T5) is turned off in this period. When the (N)th level first clock signal (CK(N)) is low, the fifth switch (T5) and the fourth switch (T6) are turned on to pull down the gate signal point (Q(N)) of the GOA circuit. With the arrangement of the second positive clock signal (XCKF) and the second reverse clock signal (XCKR) with the first capacitor (C2), the high electric potentials of the gate signal point (Q(N)) and the (N)th level scanning line (G(N)) are maintained, and the normal output of the GOA circuit is ensured.

Figure 4:
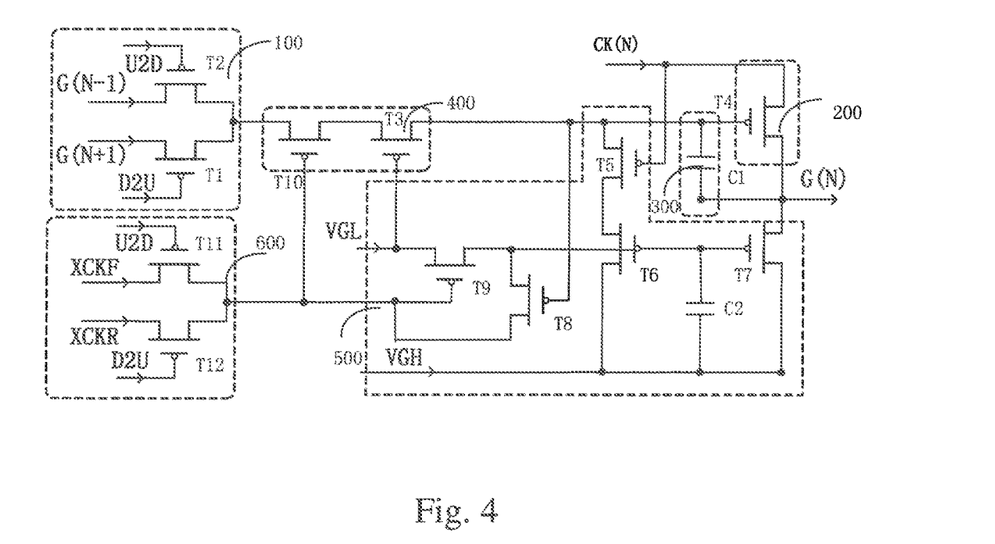
FIG. 4 is a circuit schematic diagram of a GOA circuit according to a fourth preferred embodiment of the present invention.

FIG. 4 is a circuit diagram of a GOA circuit according to a fourth preferred embodiment of the present invention. The difference between the fourth preferred embodiment and the third preferred embodiment is that the second switch (T8) connects with the control terminal of the first switch (T9) rather than the high constant voltage (VGH).

In this preferred embodiment, during operation period, by introducing the high electric potential of the second positive clock signal (XCKF) and the second reverse clock signal (XCKR) to the control terminal of the fourth switch (T6) and the control terminal of the third switch (T7), the fourth switch (T6) and the third switch (T7) can be turned off well to prevent electricity leakage.

Figure 5:
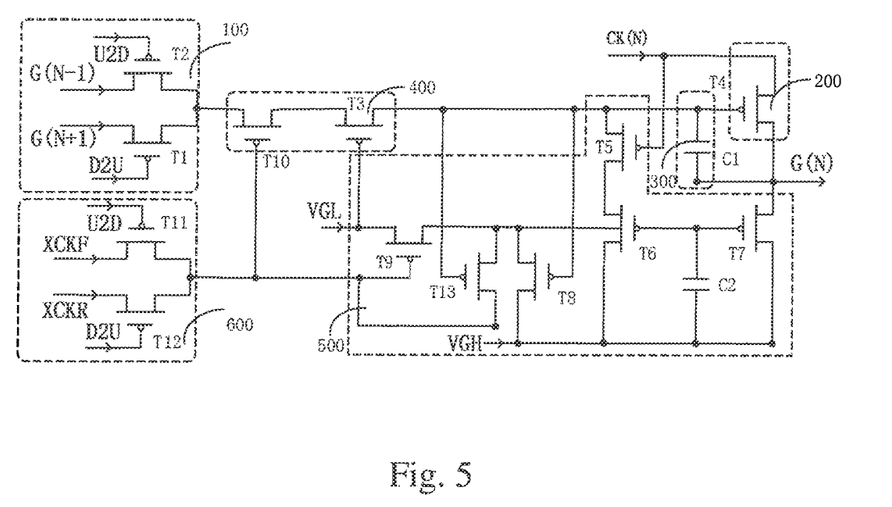
FIG. 5 is a circuit schematic diagram of a GOA circuit according to a fifth preferred embodiment of the present invention.

FIG. 5 is a circuit diagram of a GOA circuit according to a fifth preferred embodiment of the present invention. The difference between the fifth preferred embodiment and the third preferred embodiment is that the pull-down sustain circuit (500) further comprises: a thirteenth switch (T13) having a control terminal which is connected with the gate signal point (Q(N)), having an input terminal connected with the control terminal of the first switch (T9), and an output terminal being connected with the first circuit point (P(N)).

In the preferred embodiment, by adding the thirteenth switch (T13), the function of pulling the control terminal of the fourth switch (T6) and the control terminal of the third switch (T7) to high electric potentials is reinforced during the output period of the circuit; the performance of the GOA circuit is further reinforced accordingly.

Figure 6:
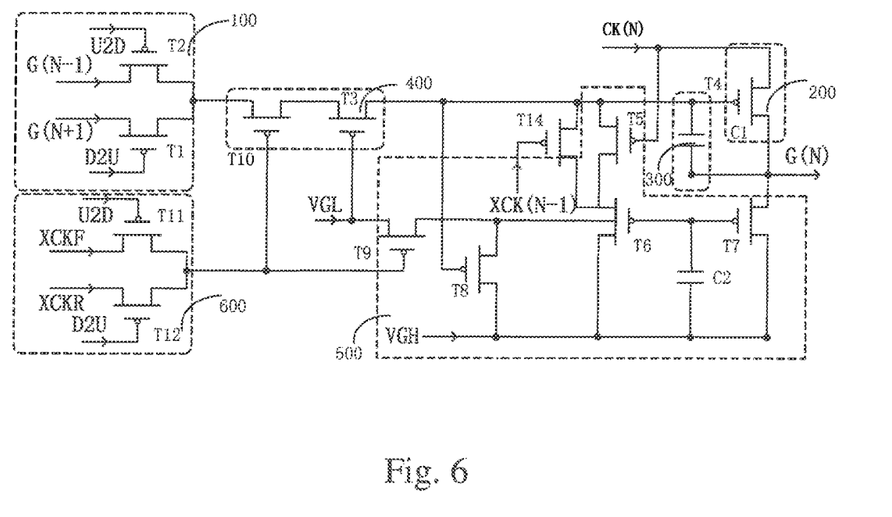
FIG. 6 is a circuit schematic diagram of a GOA circuit according to a sixth preferred embodiment of the present invention.

FIG. 6 is a circuit diagram of a GOA circuit according to a sixth preferred embodiment of the present invention. The difference between the sixth preferred embodiment and the third preferred embodiment is that the pull-down sustain circuit (500) further comprises: a fourteenth switch (T14) having a control terminal which receives an (N−1)th level second clock signal (XCK(N−1)), having an input terminal being connected with the output terminal of the fourth switch (T6), and having an output terminal being connected with the gate signal point (Q(N)).

In this preferred embodiment, by adding the fourteenth switch (T14), the function of pulling the control terminal of the fourth switch (T6) and the control terminal of the third switch (T7) to low electric potentials is reinforced during the output period of the circuit; the performance of the GOA circuit is further reinforced accordingly. This ensures that the period of pull down is increased to increase the pull down function.

Figure 7:
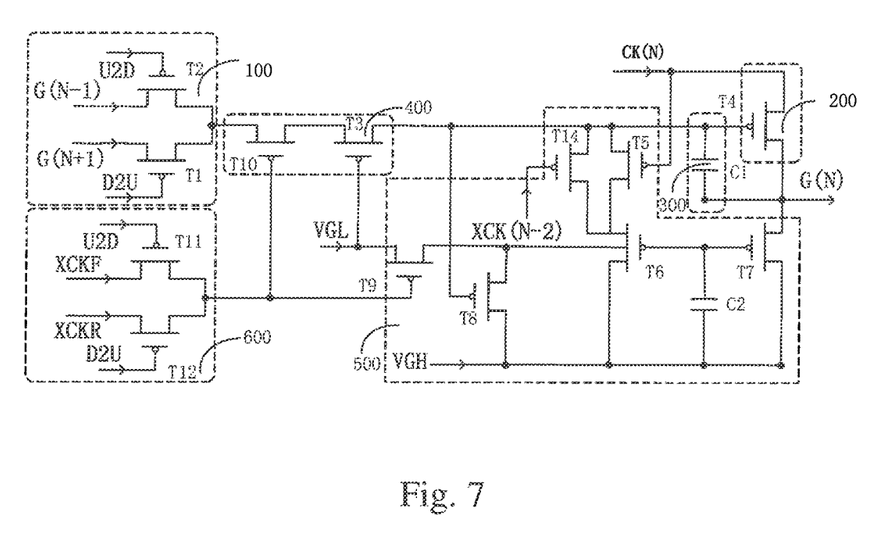
FIG. 7 is a circuit schematic diagram of a GOA circuit according to a seventh preferred embodiment of the present invention.

FIG. 7 is a circuit diagram of a GOA circuit according to a seventh preferred embodiment of the present invention. The difference between the seventh preferred embodiment and the sixth preferred embodiment is that the control terminal of the fourteenth switch receives the (N−2)th level second clock signal (XCK(N−2)).

In this preferred embodiment, with the amendment of the control terminal of the fourteenth switch (T14), the function of pulling the control terminal of the fourth switch (T6) and the control terminal of the third switch (T7) to low electric potentials is reinforced during the output period of the circuit; the waveform is separately pulled down, and the performance of the GOA circuit is further reinforced accordingly. This ensures that the period of pull down is increased to increase the pull down function.

In FIGS. 1-8, the first to the fourteenth switches are PMOS TFTs where the control terminals indicate a gate electrode, the input terminals indicate a source electrode, and the output terminals indicate a drain electrode.

Figure 8:
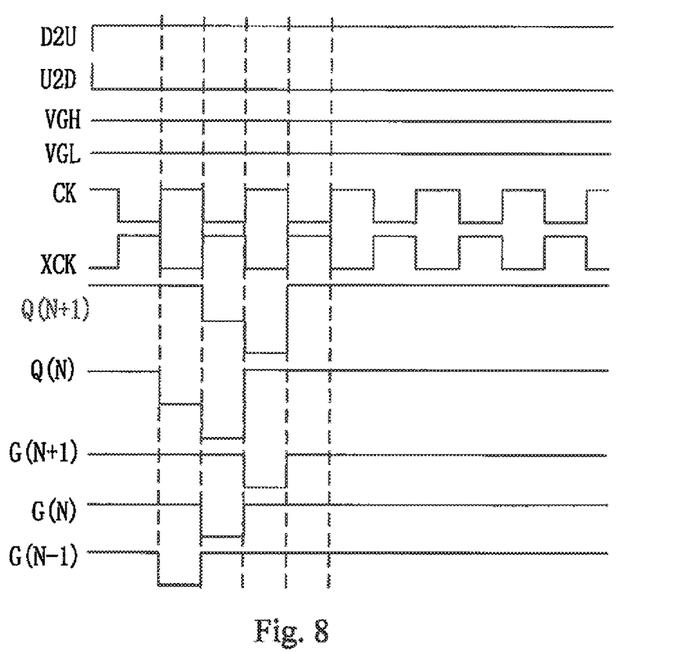
FIG. 8 is a waveform schematic diagram during rearward scanning of the GOA circuits shown in FIGS. 1-5.
Figure 9:
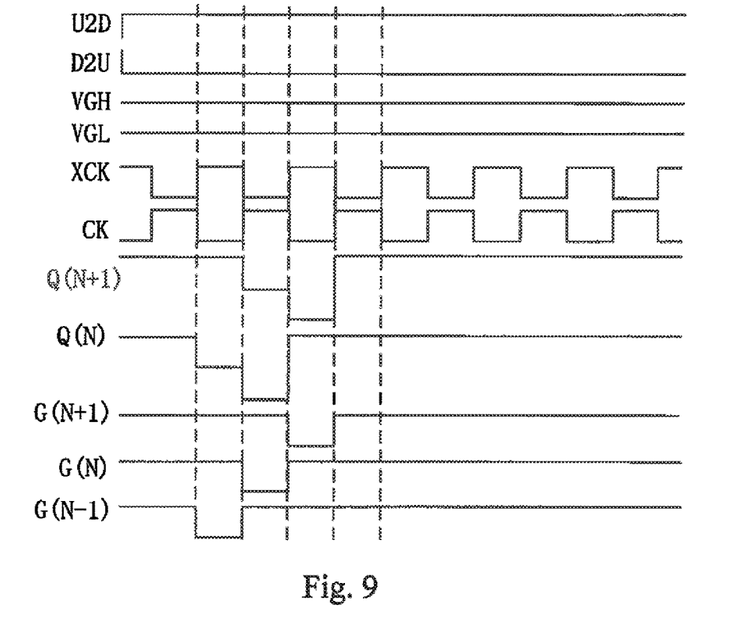
FIG. 9 is a waveform schematic diagram during forward scanning of the GOA circuits shown in FIGS. 1-5.

Please refer to FIGS. 8-9. FIG. 8 is a waveform diagram during rearward scanning of the GOA circuits shown in FIGS. 1-5. FIG. 9 is a waveform diagram during forward scanning of the GOA circuits shown in FIGS. 1-5. The down-to-up control signal (D2U) is a rearward scanning control signal, and the up-to-down control signal (U2D) is a forward scanning control signal, both of which are respectively used to start the forward scanning and the rearward scanning.

The (N)th level first clock signal (CK(N)) and the (N)th level second clock signal (XCK(N)) are responsible for the signal output of the GOA circuit and the pull-down sustainment of the gate signal point (Q(N)). The (N)th level first clock signal (CK(N)) and the (N)th level second clock signal (XCK(N)) are reverse signals of each other.

The constant high voltage (VGH) and the constant low voltage (VGL) are inputted-constant voltage signals. The constant high voltage (VGH) is a high constant electric potential and the constant low voltage (VGL) is a low constant electric potential, both of which are used to supply the high and low electric potentials to the GOA circuit. The others are output signals of the key point of the GOA circuit.

Figure 10:
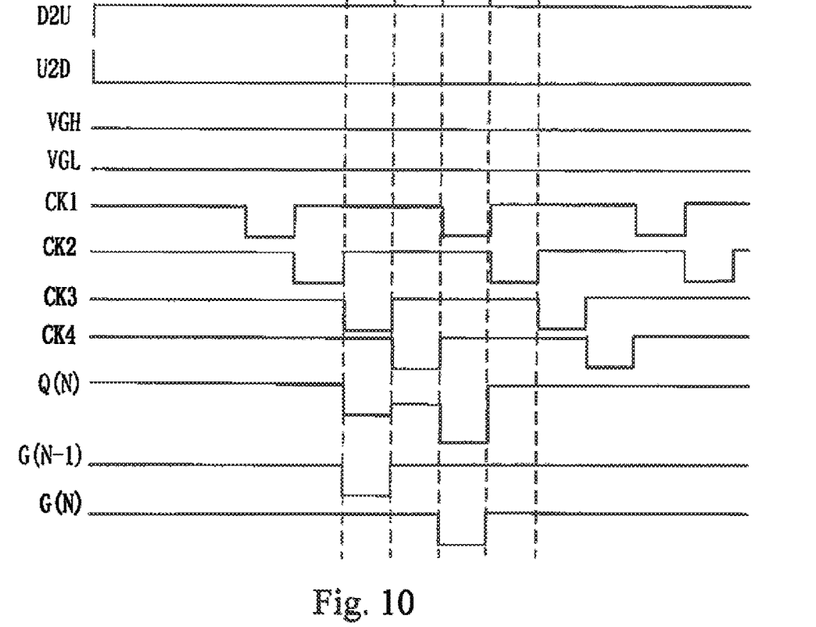
FIG. 10 is a waveform schematic diagram during rearward scanning of the GOA circuits shown in FIGS. 6-7.
Figure 11:
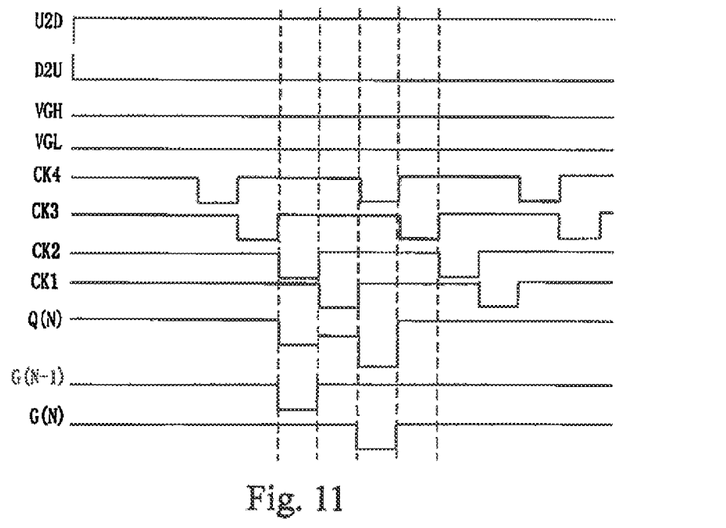
FIG. 11 is a waveform schematic diagram during forward scanning of the GOA circuits shown in FIGS. 6-7.

Please refer to FIGS. 10-11. FIG. 10 is a waveform diagram during rearward scanning of the GOA circuits shown in FIGS. 6-7. FIG. 11 is a waveform diagram during forward scanning of the GOA circuits shown in FIGS. 6-7. The down-to-up control signal (D2U) and the up-to-down control signal (U2D) are forward and rearward scanning control signals which are used to start the forward scanning and the rearward scanning. Four signals are used in these preferred embodiments; the (N)th level first clock signal (CK(N)) and the (N)th level second clock signal (XCK(N)) are alternatively changed according to variant circuit technology.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A Gate Driver On Array circuit applied to a liquid crystal display device, the liquid crystal display device comprising a plurality of scanning lines, the Gate Driver On Array circuit comprising a plurality of cascaded shift register units, wherein an Nth level shift register unit controls charge to an Nth level scanning line (G(N)), the Nth level shift register unit comprises;
   a pull-down sustain circuit (500) connected with the Nth level scanning line (G(N));
   a bootstrap capacitor circuit (300) connected with the pull-down sustain circuit (500);
   a gate signal point (Q) electricity leakage preventing circuit (400) connected with the bootstrap capacitor circuit (300);
   a forward-rearward scan circuit (100) connected with the gate signal point (Q) electricity leakage preventing circuit (400); and
   a pull-up circuit (200) connected with the bootstrap capacitor circuit (300);
   wherein the bootstrap capacitor circuit (300), the gate signal point (Q) electricity leakage preventing circuit (400), and the pull-down sustain circuit (500) are connected together with each other to form a gate signal point (Q(N));
   the pull-up circuit (200), the bootstrap capacitor circuit (300,) and the gate signal point (Q) electricity leakage preventing circuit (400), via the bootstrap capacitor circuit (300), are connected with the Nth level scanning line (G(N));
   the forward-rearward scan circuit (100) is respectively connected with an N−1th level scanning line (G(N−1)) and an N+1th level scanning line (G(N+1));
   the pull-down sustain circuit (500) comprises:
      a first switch (T9) having a control terminal which is connected with the gate signal point (Q) electricity leakage preventing circuit (400), and having an output terminal connected with a first circuit point (P(N));
      a second switch (T8) having a control terminal which is connected with the gate signal point (Q(N), and having an output terminal connected with the first circuit point (P(N));
      a third switch (T7) having a control terminal which is connected with the first circuit point (P(N)), having an input terminal connected with a high constant voltage (VGH), and having an output terminal connected with the Nth level scanning line (G(N));
      a fourth switch (T6) having a control terminal which is connected with the first circuit point (P(N)), and having an input terminal connected with the high constant voltage (VGH);
      a fifth switch (T5) having a control terminal receiving an Nth level first clock signal (CK(N)), having an input terminal connected with an output of the fourth switch (T6), and having an output terminal connected with the gate signal point (Q; and
      a first capacitor (C2) having two ends which are respectively connected with the high constant voltage (VGH) and the first circuit point (P(N));
   the forward-rearward scan circuit (100) comprises:
      a sixth switch (T1) having a control terminal which receives an up-to-down control signal (U2D), an input terminal connected with the N−1th level scanning line (G(N−1)), and an output terminal connected with the gate signal point (Q) electricity leakage preventing circuit (400);
      a seventh switch (T2) having a control terminal which receives a down-to-up control signal (D2U), an input terminal connected with the N+1th level scanning line (G(N+1)), and an output terminal connected with the output terminal of the sixth switch (T1) and the gate signal point (Q) electricity leakage preventing circuit (400);
   the gate signal point (Q) electricity leakage preventing circuit (400) comprises:
      a ninth switch (T3) having a control terminal which is connected with an input terminal of the first switch (T9) to receive an Nth level second clock signal (XCK(N)), having an input terminal connected with the output terminal of the sixth switch (T1) and the output terminal of the seventh switch (T2), and having an output terminal connected with the gate signal point (Q(N));
   the Nth level second clock signal (XCK(N)) and the first clock signal (CK) are reverse signals with regard to each other;
   the gate signal point (Q) electricity leakage preventing circuit (400) comprises:
      the ninth switch (T3);
      a tenth switch (T10) having a control terminal which is connected with the control terminal of the first switch (T9), having an input terminal connected with the output terminal of the sixth switch (T1) and the output terminal of the seventh switch (T2), and having an output terminal connected with the input terminal of the ninth switch (T3);
   the bootstrap capacitor circuit (300) comprises:
      a second capacitor (C1) having two ends which are respectively connected with the gate signal point (Q(N)) and the Nth level scanning line (G(N));
   a pull-down control circuit (600) that comprises:
      an eleventh switch (T11) having a control terminal which receives the up-to-down control signal (U2D), having an input terminal which receives a second positive clock signal (XCKF), and having an output terminal connected with the pull-down sustain circuit (500) and the gate signal point (Q) electricity leakage preventing circuit (400);
      a twelfth switch (T12) having a control terminal which receives the down-to-up control signal (D2U), having an input terminal which receives a second reverse clock signal (XCKR), and having an output terminal connected with the pull-down sustain circuit (500) and the gate signal point (Q) electricity leakage preventing circuit (400);

the output terminal of the eleventh switch (T11), the output terminal of the twelfth switch (T12), and the control terminal of the first switch (T9) being connected with each other;

the pull-down sustain circuit (500) further comprises:

a thirteenth switch (T13) having a control terminal which is connected with the gate signal point (Q), having an input terminal connected with the control terminal of the first switch (T9), and having an output terminal connected with the first circuit point (P(N));

wherein the pull-down sustain circuit comprises:

a fourteenth switch (T14) having a control terminal which receives an N−1th level second clock signal (XCK(N−1)), having an input terminal connected with the output terminal of the fourth switch (T6), and having an output terminal connected with the gate signal point (Q(N)).

2. The Gate Driver On Array circuit applied to the liquid crystal display device according to claim 1, wherein the pull-up circuit (200) comprises:

an eighth switch (T4) having a control terminal which is connected with the gate signal point (Q(N)), having an input terminal connected with the Nth level first clock signal (CK(N)), and having an output terminal connected with the Nth level scanning line (G(N)).

3. The Gate Driver On Array circuit applied to the liquid crystal display device according to claim 2, wherein the eighth switch is a PMOS thin film transistor.

4. The Gate Driver On Array circuit applied to the liquid crystal display device according to claim 1, wherein the pull-down sustain circuit (500) further comprises:

a fourteenth switch (T14) having a control terminal which receives an N−2th level second clock signal (XCK(N−2)), having an input terminal connected with the output terminal of the fourth switch (T6), and having an output terminal connected with the gate signal point (Q(N)).

5. The Gate Driver On Array circuit applied to the liquid crystal display device according to claim 4, wherein the fourteenth switch is a PMOS thin film transistor.

6. The Gate Driver On Array circuit applied to the liquid crystal display device according to claim 1, wherein the first to the seventh switch and the ninth to the twelfth switch are PMOS (P-channel metal-oxide semiconductor) thin film transistors.

7. The Gate Driver On Array circuit applied to the liquid crystal display device according to claim 1, wherein the thirteenth switch is a PMOS thin film transistor.

8. A Gate Driver On Array circuit applied to a liquid crystal display device, the liquid crystal display device comprising a plurality of scanning lines, the Gate Driver On Array circuit comprising a plurality of cascaded shift register units, wherein an Nth level shift register unit controls charge to an Nth level scanning line (G(N)), the Nth level shift register unit comprises:

a pull-down sustain circuit (500) connected with the Nth level scanning line (GUN));

a bootstrap capacitor circuit (300) connected with the pull-down sustain circuit (500);

a gate signal point (Q) electricity leakage preventing circuit (400) connected with the bootstrap capacitor circuit (300);

a forward-rearward scan circuit (100) connected with the gate signal point (Q) electricity leakage preventing circuit (400); and a pull-up circuit (200) connected with the bootstrap capacitor circuit (300);

wherein the bootstrap capacitor circuit (300), the gate signal point (Q) electricity leakage preventing circuit (400), and the pull-down sustain circuit (500) are connected together with each other to form a gate signal point (Q(N));

the pull-up circuit (200), the bootstrap capacitor circuit (300,) and the gate signal point (Q) electricity leakage preventing circuit (400), via the bootstrap capacitor circuit (300), are connected with the Nth level scanning line (G(N));

the forward-rearward scan circuit (100) is respectively connected with an N−1th level scanning line (G(N−1)) and an N+1th level scanning line (G(N+1));

the pull-down sustain circuit (500) comprises:

a first switch (T9) having a control terminal which is connected with the gate signal point (Q) electricity leakage preventing circuit (400), and having an output terminal connected with a first circuit point (P(N));

a second switch (T8) having a control terminal which is connected with the gate signal point (Q(N)), and having an output terminal connected with the first circuit point (P(N));

a third switch (T7) having a control terminal which is connected with the first circuit point (P(N)), having an input terminal connected with a high constant voltage (VGH), and having an output terminal connected with the Nth level scanning line (G(N));

a fourth switch (T6) having a control terminal which is connected with the first circuit point (P(N)), and having an input terminal connected with the high constant voltage (VGH);

a fifth switch (T5) having a control terminal which receives an Nth level first clock signal (CK(N)), having an input terminal connected with an output of the fourth switch (T6), and having an output terminal connected with the gate signal point (Q); and a first capacitor (C2) having two ends which are respectively connected with the high constant voltage (VGH) and the first circuit point (P(N));

wherein the Nth level shift register unit further comprises a pull-down control circuit (600) which comprises:

an eleventh switch (T11) having a control terminal which receives the up-to-down control signal (U2D), having an input terminal which receives a second positive clock signal (XCKF), and having on output terminal connected with the pull-down sustain circuit (500) and the gate signal point (Q) electricity leakage preventing circuit (400);

a twelfth switch, (T12) having a control terminal which receives the down-to-up control signal (D2U), having an input terminal which receives a second reverse clock signal (XCKR), and having an output terminal connected with the pull-down sustain circuit (500) and the gate signal point (Q) electricity leakage preventing circuit (400); wherein the output terminal of the eleventh switch (T11), the output terminal of the twelfth switch (T12), and the control terminal of the first switch (T9) are connected with each other; wherein the pull-down sustain circuit (500) further comprises: a fourteenth switch (T14) comprises a control terminal which receives an N−1th level second clock signal (XCK(N−1)), having an input terminal connected with the output terminal of the fourth switch (T6) and having an output terminal connected with the gate signal mint (Q(N)).

9. The Gate Driver On Array circuit applied to the liquid crystal display device according to claim 8, wherein the forward-rearward scan circuit (100) comprises:
a sixth switch (T1) having a control terminal which receives an up-to-down control signal (U2D), having an input terminal connected with the N−1th level scanning line (G(N−1)), and having an output terminal connected with the gate signal point (Q) electricity leakage preventing circuit (400);
a seventh switch (T2) having a control terminal which receives a down-to-up control signal (D2U), having an input terminal connected with the N−1th level scanning line (G(N+1)), and having an output terminal connected with the output terminal of the fifth switch (T1) and the gate signal point (Q) electricity leakage preventing circuit (400).

10. The Gate Driver On Array circuit applied to the liquid crystal display device according to claim 9, wherein the gate signal point (Q) electricity leakage preventing circuit (400) comprises:
a ninth switch (T3) having a control terminal which is connected with an input terminal of the first switch (T9) to receive an Nth level second clock signal (XCK(N)), having an input terminal connected with the output terminal of the sixth switch (T1) and the output terminal of the seventh switch (T2), and having an output terminal connected with the gate signal point (Q(N)).

11. The Gate Driver On Array circuit applied to the liquid crystal display device according to claim 10, wherein the Nth level second clock signal (XCK(N)) and the Nth level first clock signal (CK(N)) are reverse signals with regard to each other.

12. The Gate Driver On Array circuit applied to the liquid crystal display device according to claim 10, wherein the ninth switch is a PMOS thin film transistor.

13. The Gate Driver On Array circuit applied to the liquid crystal display device according to claim 9, wherein the gate signal point (Q) electricity leakage preventing circuit (400) comprises:
a ninth switch (T3) having a control terminal which is connected with an input terminal of the first switch (T9) and a constant low voltage (VGL), and having an output terminal connected with the gate signal point (Q(N));
a tenth switch (T10) having a control terminal which is connected with the control terminal of the first switch (T9), having an input terminal connected with the output terminal of the sixth switch (T1) and the output terminal of the seventh switch (T2), and having an output terminal connected with the input terminal of the ninth switch (T3).

14. The Gate Driver On Array circuit applied to the liquid crystal display device according to claim 13, wherein the control terminal of the tenth switch (T10) is connected with the control terminal of the first switch (T9) to receive the Nth level second clock signal (XCK(N)).

15. The Gate Driver On Array circuit applied to the liquid crystal display device according to claim 13, wherein the ninth to the tenth switch are PMOS thin film transistors.

16. The Gate Driver On Array circuit applied to the liquid crystal display device according to claim 9, wherein the sixth to seventh switches are PMOS thin film transistors.

17. The Gate Driver On Array circuit applied to the liquid crystal display device according to claim 8, wherein the pull-up circuit (200) comprises:
an eighth switch (T4) having a control terminal which is connected with the gate signal point (Q(N)), having an input terminal connected with the Nth level first clock signal (CK(N)), and having an output terminal connected with the Nth level scanning line (G(N)).

18. The GOA Gate Driver On Array circuit applied to the liquid crystal display device according to claim 17, wherein the eighth switch is a PMOS thin film thin film transistor.

19. The Gate Driver On Array circuit applied to the liquid crystal display device according to claim 8, wherein the bootstrap capacitor circuit (300) comprises:
a second capacitor (C1) having two ends which are respectively connected with the gate signal point (Q(N)) and the Nth level scanning line (G(N)).

20. The Gate Driver On Array circuit applied to the liquid crystal display device according to claim 8, wherein the input terminal of the second switch (T8) is connected with the high constant voltage (VGH).

21. The Gate Driver On Array circuit applied to the liquid crystal display device according to claim 8, wherein the input terminal of the second switch (T8) is connected with the control terminal of the first switch (19).

22. The Gate Driver On Array circuit applied to the liquid crystal display device according to claim 8, wherein the pull-down sustain circuit (500) further comprises:
a thirteenth switch (T13) having a control terminal which is connected with the gate signal point (Q), having an input terminal connected with the control terminal of the first switch (T9), and having an output terminal connected with the first circuit point (P(N)).

23. The Gate Driver On Array circuit applied to the liquid crystal display device according to claim 22, wherein the thirteenth switch is a PMOS thin film transistor.

24. The Gate Driver On Array circuit applied to the liquid crystal display device according to claim 8, wherein the first to the fifth switches are PMOS thin film transistors.

25. The Gate Driver On Array circuit applied to the liquid crystal display device according to claim 8, wherein the eleventh to the twelfth switch are PMOS thin film transistors.

26. The Gate Driver On Array circuit applied to the liquid crystal display device according to claim 8, wherein the fourteenth switch is a PMOS thin film transistor.

27. A Gate Driver On Array circuit applied to a liquid crystal display device, the liquid crystal display device comprising a plurality of scanning lines, the Gate Driver On Array circuit comprising a plurality of cascaded shift register units, wherein an Nth level shift register unit controls charge to an Nth level scanning line (G(N)), the Nth level shift register unit comprises:
a pull-down sustain circuit (500) connected with the Nth level scanning line (G(N));
a bootstrap capacitor circuit (300) connected with the pull-down sustain circuit (500);
a gate signal point (Q) electricity leakage preventing circuit (400) connected with the bootstrap capacitor circuit (300);
a forward-rearward scan circuit (100) connected with the gate signal point (Q) electricity leakage preventing circuit (400); and
a pull-up circuit (200) connected with the bootstrap capacitor circuit (300);
wherein the bootstrap capacitor circuit (300), the gate signal point (Q) electricity leakage preventing circuit (400), and the pull-down sustain circuit (500) are connected together with each other to form a gate signal point (Q(N));

the pull-up circuit (200), the bootstrap capacitor circuit (300) and the gate signal point (Q) electricity leakage preventing circuit (400), via the bootstrap capacitor circuit (300), are connected with the Nth level scanning line (G(N));

the forward-rearward scan circuit (100) is respectively connected with an N−1th level scanning line (G(N−1)) and an N+1th level scanning line (G(N+1));

the pull-down sustain circuit (500) comprises:
- a first switch (T9) having a control terminal which is connected with the gate signal point (Q) electricity leakage preventing circuit (400), and having an output terminal connected with a first circuit point (P(N));
- a second switch (T8) having a control terminal which is connected with the gate signal point (Q(N), and having an output terminal connected with the first circuit point (P(N));
- a third switch (T7) having a control terminal which is connected with the first circuit point (P(N)), having an input terminal connected with a high constant voltage (VGH), and having an output terminal connected with the Nth level scanning line (G(N));
- a fourth switch (T6) having a control terminal which is connected with the first circuit point (P(N)), and having an input terminal connected with the high constant voltage (VGH);
- a fifth switch (T5) having a control terminal which receives an Nth level first clock signal (CK(N)), having an input terminal connected with an output of the fourth switch (T6), and having an output terminal connected with the gate signal point (Q); and
- a first capacitor (C2) having two ends which are respectively connected with the high constant voltage (VGH) and the first circuit point (P(N));

wherein the Nth level shift register unit further comprises a pull-down control circuit (600) which comprises:
- an eleventh switch (T1) having a control terminal which receives the up-to-down control signal (U2D), having an input terminal which receives a second positive clock signal (XCKF), and having an output terminal connected with the pull-down sustain circuit (500) and the gate signal point (Q) electricity leakage preventing circuit (400);
- a twelfth switch (T12) having a control terminal which receives the down-to-up control signal (D2U), having an input terminal which receives a second reverse clock signal (XCKR), and having an output terminal connected with the pull-down sustain circuit (500) and the gate signal point (Q) electricity leakage preventing circuit (400); wherein the output terminal of the eleventh switch (T11), the output terminal of the twelfth switch (T12), and the control terminal of the first switch (T9) are connected with each other; wherein the pull-down sustain circuit (500) further comprises:
- a fourteenth switch (T14) having a control terminal which receives an N−2th level second clock signal (XCK(N−2)), having an input terminal connected with the output terminal of the fourth switch (T6), and having an output terminal connected with the gate signal point (Q(N)).

28. The Gate Driver On Array circuit applied to the liquid crystal display device according to claim 27, wherein the fourteenth switch is a PMOS thin film transistor.

\* \* \* \* \*

UNITED STATES PATENT AND TRADEMARK OFFICE
CERTIFICATE OF CORRECTION

PATENT NO. : 9,626,928 B2  Page 1 of 1
APPLICATION NO. : 14/418087
DATED : April 18, 2017
INVENTOR(S) : Juncheng Xiao It is certified that error appears in the above-identified patent and that said Letters Patent is hereby corrected as shown below:

In the Claims

Claim 1, Column 11 Line 14 Change:
-- wherein the pull-down sustain circuit comprises --
To:
"wherein the pull-down sustain circuit (500) further comprises"

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*